United States Patent
Zeyen

(10) Patent No.: US 9,274,180 B2
(45) Date of Patent: Mar. 1, 2016

(54) MICROFABRICATED MAGNETIC FIELD TRANSDUCER WITH FLUX GUIDE

(71) Applicant: Benedikt Zeyen, Santa Barbara, CA (US)

(72) Inventor: Benedikt Zeyen, Santa Barbara, CA (US)

(73) Assignee: Innovative Mion Technology, Goleta, CA (US)

( * ) Notice: Subject to any disclaimer, the term of this patent is extended or adjusted under 35 U.S.C. 154(b) by 169 days.

(21) Appl. No.: 13/987,463

(22) Filed: Jul. 29, 2013

(65) Prior Publication Data

US 2015/0028863 A1  Jan. 29, 2015

(51) Int. Cl.
*G01R 33/02* (2006.01)
*G01R 33/00* (2006.01)

(52) U.S. Cl.
CPC ........ *G01R 33/0052* (2013.01); *G01R 33/0011* (2013.01)

(58) Field of Classification Search
CPC .... G01R 15/185; G01R 19/20; G01R 33/093; G01R 33/0011; G01R 15/207; G01R 33/09; G01R 33/07; G01R 15/202
See application file for complete search history.

(56) References Cited

U.S. PATENT DOCUMENTS

| | | | | |
|---|---|---|---|---|
| 5,523,687 | A * | 6/1996 | Mouchot et al. | 324/252 |
| 5,889,215 | A * | 3/1999 | Kilmartin et al. | 73/862.335 |
| 6,504,363 | B1 * | 1/2003 | Dogaru et al. | 324/235 |
| 2008/0271818 | A1 * | 11/2008 | Paul et al. | 148/108 |
| 2009/0243594 | A1 * | 10/2009 | Kahlman | 324/202 |
| 2011/0027901 | A1 * | 2/2011 | Gaster et al. | 436/149 |
| 2011/0062956 | A1 * | 3/2011 | Edelstein | 324/251 |
| 2011/0309829 | A1 * | 12/2011 | Loreit et al. | 324/252 |
| 2012/0038360 | A1 * | 2/2012 | Lenglet | 324/253 |
| 2013/0300402 | A1 * | 11/2013 | Liu et al. | 324/202 |
| 2014/0070798 | A1 * | 3/2014 | Stanley | 324/207.13 |

* cited by examiner

*Primary Examiner* — Alesa Allgood
(74) *Attorney, Agent, or Firm* — Jaquelin K. Spong

(57) ABSTRACT

A microfabricated magnetic field transducer uses a magnetically sensitive structure in combination with one or more permeable magnetic flux guides. The flux guides may route off-axis components of an externally applied magnetic field across the sensitive axis of the magnetically sensitive structure, or may shield the magnetically sensitive structure from off-axis, stray fields or noise sources. A combination of flux guides and magnetically sensitive structures arranged on a single substrate may enable an integrated, 3-axis magnetometer in a single package, greatly improving cost and performance.

5 Claims, 14 Drawing Sheets

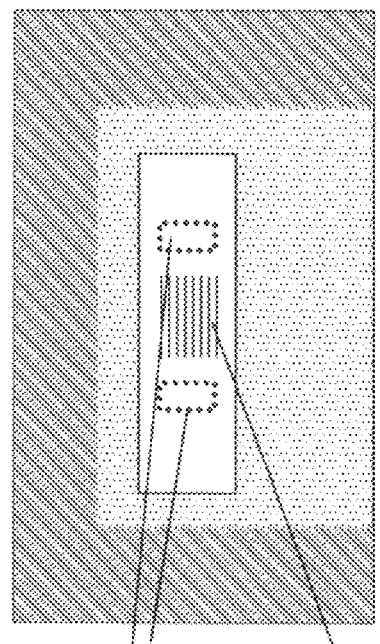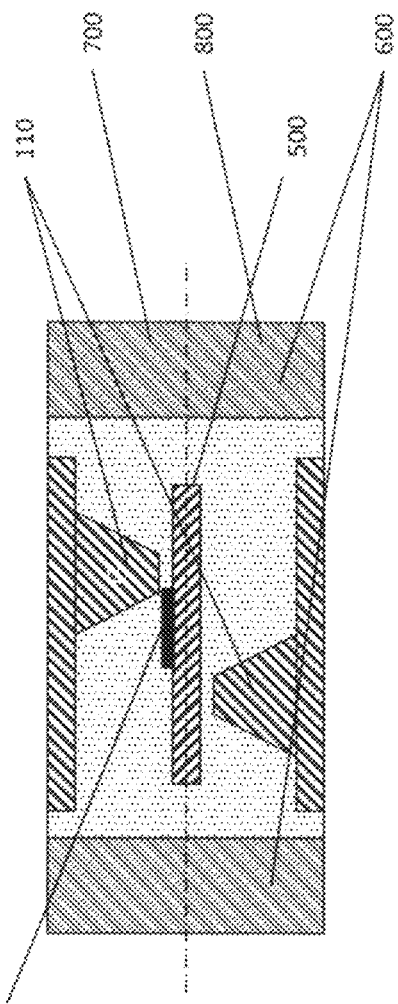
Fig. 14a
Fig. 14b

MICROFABRICATED MAGNETIC FIELD TRANSDUCER WITH FLUX GUIDE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a microfabricated transducer used for sensing the direction and magnitude of a magnetic field.

Microelectromechanical systems are devices which are manufactured using lithographic fabrication processes originally developed for producing semiconductor electronic devices. Because the manufacturing processes are lithographic, MEMS devices may be made in very small sizes. MEMS techniques have been used to manufacture a wide variety of transducers and actuators, such as accelerometers and electrostatic cantilevers.

Magnetically sensitive structures employing effects such as anisotropic magneto resistance (AMR) and giant magnetoresistance (GMR) are well known in the field of magnetic recording, and may be fabricated using MEMS and integrated circuit lithographic processes. These microfabricated devices provide a response to an applied magnetic field, for example, that arising from individual domains created in a magnetic recording medium. Because of their small size, the AMR and GMR sensors can resolve very small bit sizes and thus increase the density and storage capacity of the recording medium. Accordingly, these devices are suitable for detecting relatively large changes in flux density over a relatively small spatial dimension. However, when these transducers are used to detect slowly varying, extensive magnetic fields, such as the earth's magnetic field, their small size limits their performance. Furthermore, extensive fields may give rise to noise in the sensor, such that measures are often taken to shield the sensor from such fields.

For example, U.S. Pat. No. 7,898,249 to Paul, et al. discloses a microfabricated magnetoresistive (AMR) and giant magnetoresistive (GMR) transducer which uses a soft magnetic material to shield the transducer from stray or long ranging magnetic fields. U.S. Pat. No. 7,898,249 is incorporated by reference in its entirety. Because of the presence of the shields, magnetic fields between the closely spaced shields are substantially perpendicular to the direction of the gap between the respective flux guides, and thus arise primarily from the domains created in the data storage medium.

Hall effect sensors can also be used to detect the position of a small magnet on a movable component, as described for example, in U.S. Pat. No. 8,285,328. Because of the low output, these sensors generally must be disposed in close proximity to the magnet, and are thus also not useful for detecting or measuring extensive magnetic fields.

Because the size of these microfabricated devices is small, when making field sensing devices, the capture area of the device within that field may also be small, and therefore the signal or output of the sensor may be small as well.

Furthermore, prior art magnetic field transducers which are capable of detecting and measuring components of a magnetic field lying along any or all of the three orthogonal spatial axes, x-, y- and z- have required the fabrication and packaging of three separate, independent transducers. Current technology either packages several transducer dies each sensitive in the x-, y- and/or z-directions into one package, thus increasing packaging cost and complexity, or are utilizing technologies other than semiconductor based technologies, e.g. using proof masses. Proof mask based transducers have moving parts and can therefore break upon mechanical shock or magnetic overloading.

Because of this requirement, 3-axis magnetic field sensing has remained a relatively costly and complex endeavor, and the 3-axis devices may be resultingly too large to be inserted into very small spaces. In fact, common highly sensitive semiconductor based magnetic transducers are only sensitive to one single direction x-in plane of the wafer while ignoring magnetic field components in the other directions y-and z-. For many applications sensitivity in more than one direction is desired, often with space restrictions, for example in consumer goods.

SUMMARY

Therefore a need exists for a microfabricated magnetic field transducer with larger output or greater sensitivity, and which can be used to measure extensive magnetic fields. Furthermore, a need exists for a small, inexpensive and robust 3-axis magnetic field transducer.

The systems and methods described below are directed to a magnetic field sensor which has enhanced performance attributes for the detection or measurement of an externally applied magnetic field. In particular, the sensor described below uses one or more magnetically permeable structures to gather flux lines of the magnetic field and apply them across the sensitive axis of the magnetically sensitive structure. The magnetic sensor may include a magnetically sensitive structure having one axis of maximum sensitivity, disposed on a surface of a substrate and at least one flux guide having high magnetic permeability and configured to route at least one component of the external magnetic field along the one axis of the magnetically sensitive member. Further, the at least one flux guide may include a protruding portion and an extensive portion adjacent to the protruding portion, wherein the protruding portion is closer to the magnetically sensitive structure than the extensive portion, such that flux in the magnetically sensitive structure is delivered more by the protruding portion than the extensive portion.

In addition, the at least one flux guide may be shaped in such a way as to suppress the detection of stray or spurious fields, or noise sources that would otherwise degrade the measurement. As used herein, the term "off-axis component" is a component of the external magnetic field which is not parallel to the one axis of maximum sensitivity of the magnetically sensitive structure, and which therefore may be a noise source. The at least one flux guide may also have a second protruding portion, wherein the second protruding portion routes the off-axis flux around the magnetically sensitive structure by providing a low reluctance path avoiding the magnetically sensitive structure. The magnetically sensitive structure may thereby be less sensitive to noise sources such as off-axis magnetic fields.

The systems and methods disclosed here may also be used to construct a 3-axis integrated magnetic field sensor, which is capable of producing three signals proportional to the three orthogonal components of a generally oriented, applied magnetic field.

BRIEF DESCRIPTION OF THE DRAWINGS

The present invention will be understood more fully from the following detailed description, and from the accompanying drawings, which however, should not be taken to limit the invention to the specific embodiments shown but are for explanation and understanding only. It should be understood that these drawings do not necessarily depict the structures to scale, and that directional designations such as "top," "bottom," "upper," "lower," "left" and "right" are arbitrary, as the device may be constructed and operated in any particular orientation.

FIG. 14a is a plan view and FIG. 14b is a cross sectional diagram of a manufacturing process including packaging for the microfabricated device with a magnetically sensitive structure having a flux guides, wherein the manufacturing process includes standard machining and semiconductor packaging techniques.

DETAILED DESCRIPTION

Figure 1:
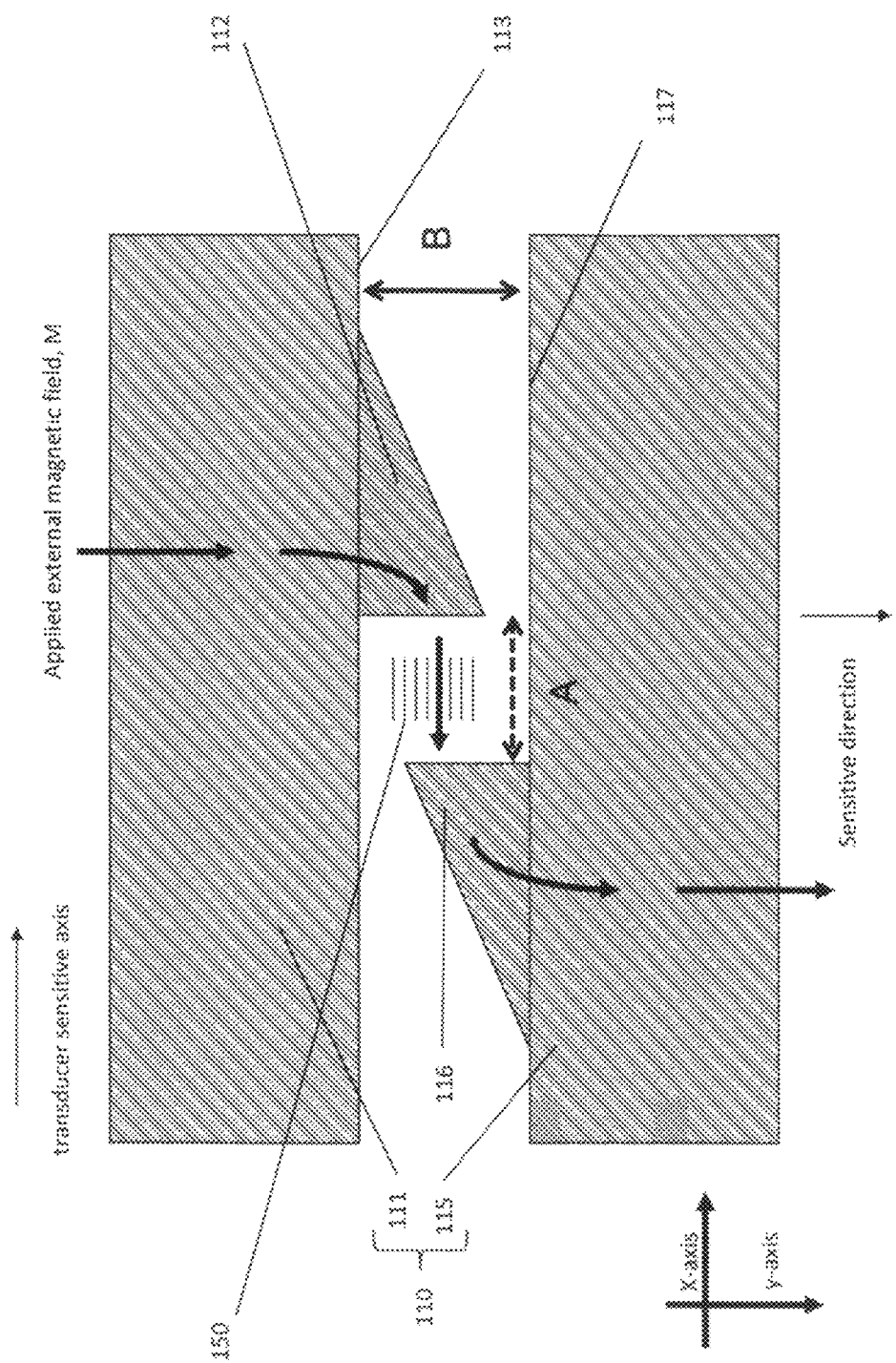
FIG. 1 is a simplified illustration of a magnetically sensitive structure with permeable flux guides that route flux from the externally applied field along the sensitive axis of the magnetically sensitive structure.

The systems and methods set forth herein are described with respect to a particular embodiment, that of a magnetic field transducer such as an anisotropic magnetoresistive sensor (AMR) or giant magnetoresistive sensor (GMR) whose performance is enhanced by the presence of one or more shaped, permeable flux guides. However, it should be understood that the systems and methods may be applicable to a wide range of other transducers, such as earth's field and Hall effect sensors, wherein it is desired to sense a particular component of the magnetic field, which may or may not be aligned with the sensitive axis of the magnetically sensitive structure.

Magnetic fields may be detected by measuring changes in the resistivity of a certain class of materials known as magnetoresistors. Magnetoresistive elements are materials whose properties change as a function of the magnitude and/or angle of an externally applied magnetic field.

Generally, there exists a large variety of magnetoresistive element types making use of different fundamental effects. For example, the Anisotropic Magnetoresistive (AMR) effect shows a change in electrical resistance in the presence of a magnetic field. AMR sensors are typically made of a soft-magnetic material, such as nickel-iron (Permalloy) thin film deposited on a silicon wafer. The magnetoresistive signal may arise as a result of the relative direction between an electrical current and the direction of magnetization.

Another effect known as Giant Magneto Resistance (GMR) can be exploited by making use of multilayer systems. Here, the magnetoresistive element features a stack of alternating magnetic and non magnetic layers. Typically, the magnetic layers are ferromagnetic layers. The magnetizations of adjacent ferromagnetic layers are coupled in an anti-parallel orientation. The electrical resistance of such a GMR element strongly depends on the mutual orientation of the magnetization of adjacently positioned magnetic layers.

Any of these effects may be used to detect the presence and magnitude of a magnetic field. AMR and GMR structures are also amenable to lithographic processing techniques such that a large number of like devices may be fabricated on a single substrate, and may have characteristic dimensions on the order of a few microns.

Accordingly, the term "magnetically sensitive structure" should be understood to mean any device which responds to the application of a magnetic field, and may include AMR, GMR, Hall effect and Reed transducer devices, for example. Many magnetically sensitive structures, such as AMR and GMR devices, have one particular axis along which the transducer is most sensitive. Magnetic flux along this axis is more effective at generating a response by the transducer than flux orthogonal to this axis. This axis is herein referred to as "the one axis of maximum sensitivity" of the magnetically sensitive structure, and is a design feature of the device.

A magnetically permeable material should be understood to mean any material which is capable of supporting the formation of a magnetic field within itself. In other words, the permeability of a material is the degree of magnetization that the material obtains in response to an applied magnetic field. The terms "permeable material" or "material with high magnetic permeability" as used herein should be understood to be a material with a permeability which is large compared to the permeability of air or vacuum. That is, a permeable material or material with high magnetic permeability is a material with a relative permeability (compared to air or vacuum) of at least about 100, that is, 100 times the permeability of air or vacuum which is about $1.26 \times 10^{-6} \cdot m^{-1}$. There are many examples of permeable materials, including chromium (Cr) and cobalt (Co) nickel (Ni) and iron (Fe) alloys. One popular permeable material is known as Permalloy, which has a composition of between about 60% and about 90% Ni and 40% and 10% iron. The most common composition is 80% Ni and 20% Fe, which has a relative permeability of about 8,000.

It is well known from magnetostatics that permeable materials can be used to conduct lines of magnetic flux, by lowering the reluctance of the path provided by the permeable material to the flux. Because of the lower reluctance, lines of flux will preferentially enter the permeable material, such that the flux lines are drawn in and concentrated from surrounding areas by the presence of the permeable material. This aspect of permeability is used to collect and direct the lines of magnetic flux in particular ways according to the systems and methods disclosed here, to improve or enhance the performance of the magnetically sensitive structure. These permeable structures are referred to herein as "flux guides" and are used to route some components of an externally applied magnetic field in advantageous directions. The particular shapes of these novel flux guides are disclosed in detail. Permalloy may be used to create the flux guides, although it should be understood that other permeable materials may also be used.

An "on-axis" component of the externally applied magnetic field is a component of the field which, in the absence of the flux guide, lies substantially along the axis of maximum sensitivity. An "off-axis" component of the externally applied magnetic field is a component of the field which, in the absence of the flux guide, does not lie substantially along the axis of maximum sensitivity. Y- and Z-components of the externally applied magnetic field, for example, are off-axis components of the field for a magnetically sensitive structure whose axis of sensitivity lies along the x-axis.

Because of the small size of these devices, they are subject to noise coming from stray magnetic fields, fringing effects, and other phenomena. Accordingly, it is desirable to improve their performance by shielding them from stray fields, or amplifying the applied field across the elements. In addition, fabricating a detector which is sensitive to all components of an arbitrarily oriented magnetic field, in the absence of the systems and methods disclosed here, may require three separate devices to be fabricated and packaged, which greatly increases the cost and complexity of the device.

The systems and methods described herein may be used to create an integrated, three-axis magnetic field transducer in a single packaged device. These systems and methods make use of one or more specially shaped flux guides, which are layers of magnetically permeable material which provide a low reluctance path to guide the lines of flux from the magnetic field in advantageous ways. In one embodiment, the flux guides re-route flux lines which do not lie along the sensitive axis, in order to have the fluxlines cross the transducer along its sensitive axis. In another embodiment, the flux guides route off-axis flux lines around the magnetically sensitive structure, thereby suppressing the response of the transducer to these off-axis fields. In yet another embodiment, these techniques are combined to render a multi-axis transducer, having one to three outputs, corresponding to single axis, double axis or three axis operation. The systems and techniques can be made using lithographic processing, as has been developed for semiconductor and MEMS devices. The systems and methods may also make use of more standard machining and packaging techniques, as have been developed for the packaging of semiconductor integrated circuits.

FIG. 1 shows a is a simplified illustration of the magnetically sensitive structure with at least one permeable flux guide that routes flux from the externally applied field along the sensitive axis of the magnetically sensitive structure. The magnetically sensitive structure 150 may be, for example, and AMR or GMR multilayer structure, which is fabricated on the surface of a substrate. In either case, the magnetically sensitive structure 150 has a single axis, or direction, along which it is most sensitive to applied magnetic fields. That is, when the magnetic field is applied parallel to this sensitive axis, the output of the transducer is a maximum. The transducer sensitive axis is shown with an arrow in FIG. 1, and is along the x-axis as shown. The external magnetic field M is applied orthogonally to this axis in FIG. 1, and is directed vertically from the top of the page to the bottom of the page, that is, along the y-axis. At least one flux guide is disposed also on the surface of the substrate, and is patterned lithographically to have the approximate shape shown in FIG. 1. The flux guide comprises a permeable material, wherein "permeable" is defined as having a relative permeability, with respect to air, of at least 100.

FIG. 1 shows flux guides 110, including an upper flux guide 111 and a lower flux guide 115. The flux is accepted by the large dimension at the top of the flux guide 111 and flows to the bottom of the flux guide 115, exiting the bottom edge of flux guide 115. Between the top flux guide 111 and the bottom flux guide 115 is a gap that contains the magnetically sensitive structure 150. In this gap, the flux guide 111 has a protrusion 112 which extends from the lower edge of flux guide 111. Similarly, flux guide 115 has a protrusion 116 that extends into the gap. The purpose of protrusions 112 and 116 are to route the lines of vertical flux horizontally across the magnetically sensitive device 150, and therefore parallel to its sensitive axis. The flux guides 111 and 115 accomplish this by having a protruding portion 112 and 116 respectively, and a rectangular extensive portion 113 and 117 adjacent to the protruding portion, wherein the protruding portions 112 and 116 are closer to the magnetically sensitive structure 150 than the extensive portions 113 and 117. In this way, flux from the externally applied vertical field is applied horizontally to the magnetically sensitive structure 150. The heavy arrows in FIG. 1 show the routing of the lines of flux from the externally applied magnetic field M. As can be seen in FIG. 1, as long as the distance B between the extensive portions 113 and 117 is substantially greater than the distance A between the protrusions 112 and 116 and the magnetically sensitive structure 150, the flux will flow across the gap A and through the magnetically sensitive structure 150. Accordingly, the flux guides 110 may have the feature that A<B.

Accordingly, the magnetic transducer in FIG. 1 may be sensitive to an external magnetic field, and includes a magnetically sensitive structure having one axis of maximum sensitivity, disposed on a surface of a substrate and at least one flux guide having high magnetic permeability and configured to route at least one component of the external magnetic field along the one axis of the magnetically sensitive member. More particularly, the magnetic transducer of FIG. 1 may have at least one flux guide having a protruding portion and an extensive portion adjacent to the protruding portion, wherein the protruding portion is closer to the magnetically sensitive structure than the extensive portion, such that flux in the magnetically sensitive structure is delivered more by the protruding portion than the extensive portion.

Figure 2:
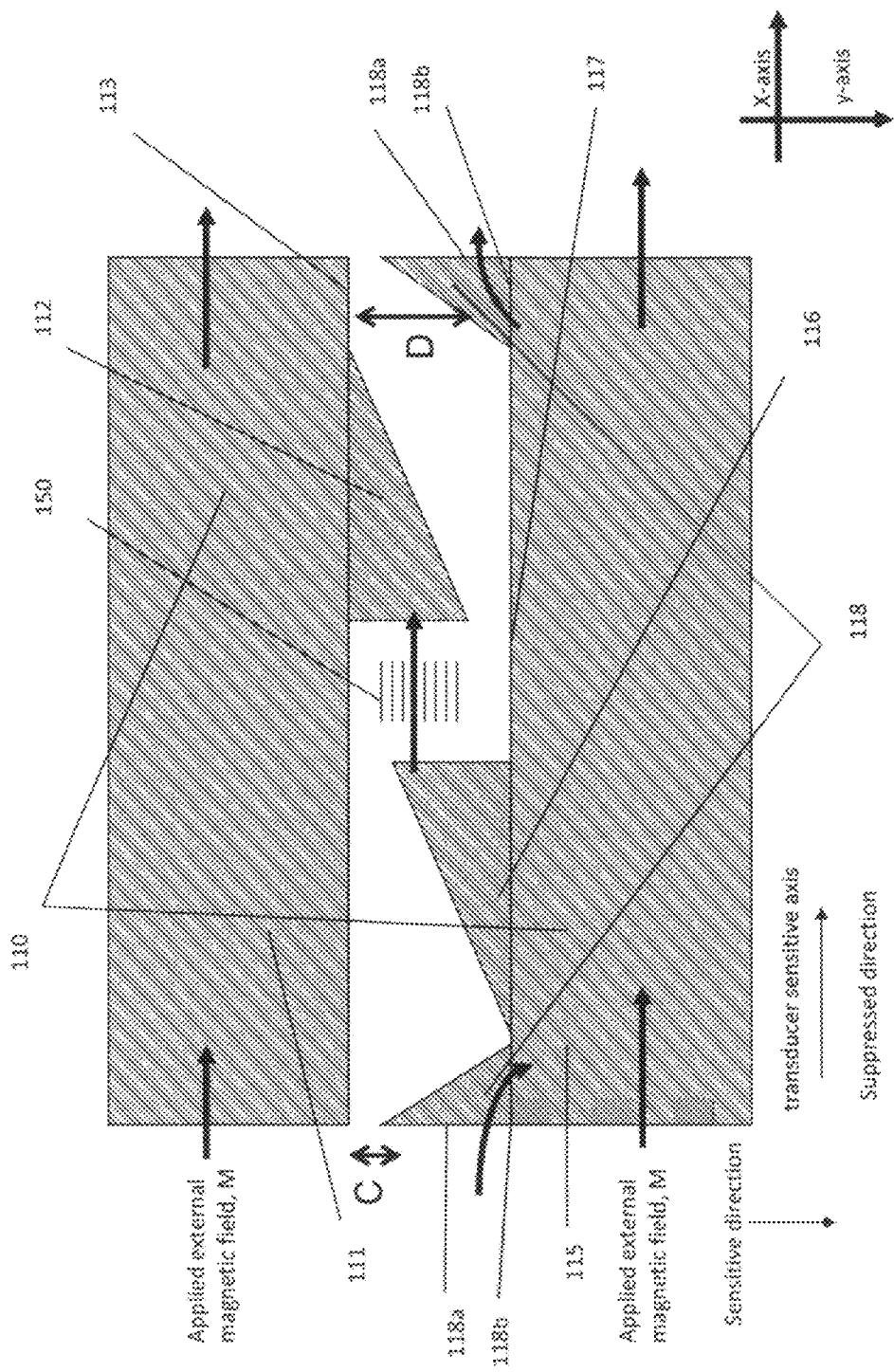
FIG. 2 is a simplified illustration of another embodiment of the magnetically sensitive structure with permeable flux guides that route flux from the externally applied field along the sensitive axis of the magnetically sensitive structure, wherein an additional protruding feature accepts flux of an off-axis component of the externally applied magnetic field and routes that flux around the magnetically sensitive structure.

FIG. 2 shows another embodiment of the magnetic sensor sensitive to an external magnetic field. In FIG. 2, the lower (or upper) flux guide is equipped with two additional features 118. These features 118 are patterned with a longer edge 118a and a shorter edge 118b. The longer edge accepts lines of flux that are travelling horizontally along the x-axis. These flux lines would otherwise enter the magnetically sensitive structure 150 and be a source of noise to the measurement of the applied external magnetic field M. Instead, these horizontal lines of flux enter the permeable flux guide 115 and travel under and around the magnetically sensitive device. It should be understood that features 118 may alternatively be associated with the top flux guide 111 rather than the lower flux guide 115. It should also be understood that only a single feature 118 may be required to provide the suppression of horizontal flux lines around the magnetically sensitive structure 150. While any of a number of shapes may be used for flux guides 111 and 115, the distinguishing feature may be that at least one flux guide has a second protruding portion, wherein the second protruding portion accepts the undesired components and routes the undesired components around the magnetically sensitive structure. The protruding portion 118 typically has a region of closest approach to the opposite flux guide, and an adjacent region that tapers away from the opposite flux guide, such that C<D.

Accordingly, the magnetic transducer in FIG. 2 has at least one flux guide which is configured to suppress undesired components of the external magnetic field which are not parallel to the one axis of the magnetically sensitive structure. Furthermore, the magnetic transducer of FIG. 2 may comprise a first flux guide and a second flux guide wherein the second flux guide has a second protruding portion and a second extensive portion, wherein the second protruding portion accepts the undesired components and the second extensive portion routes the undesired components around the magnetically sensitive structure.

Figure 3:
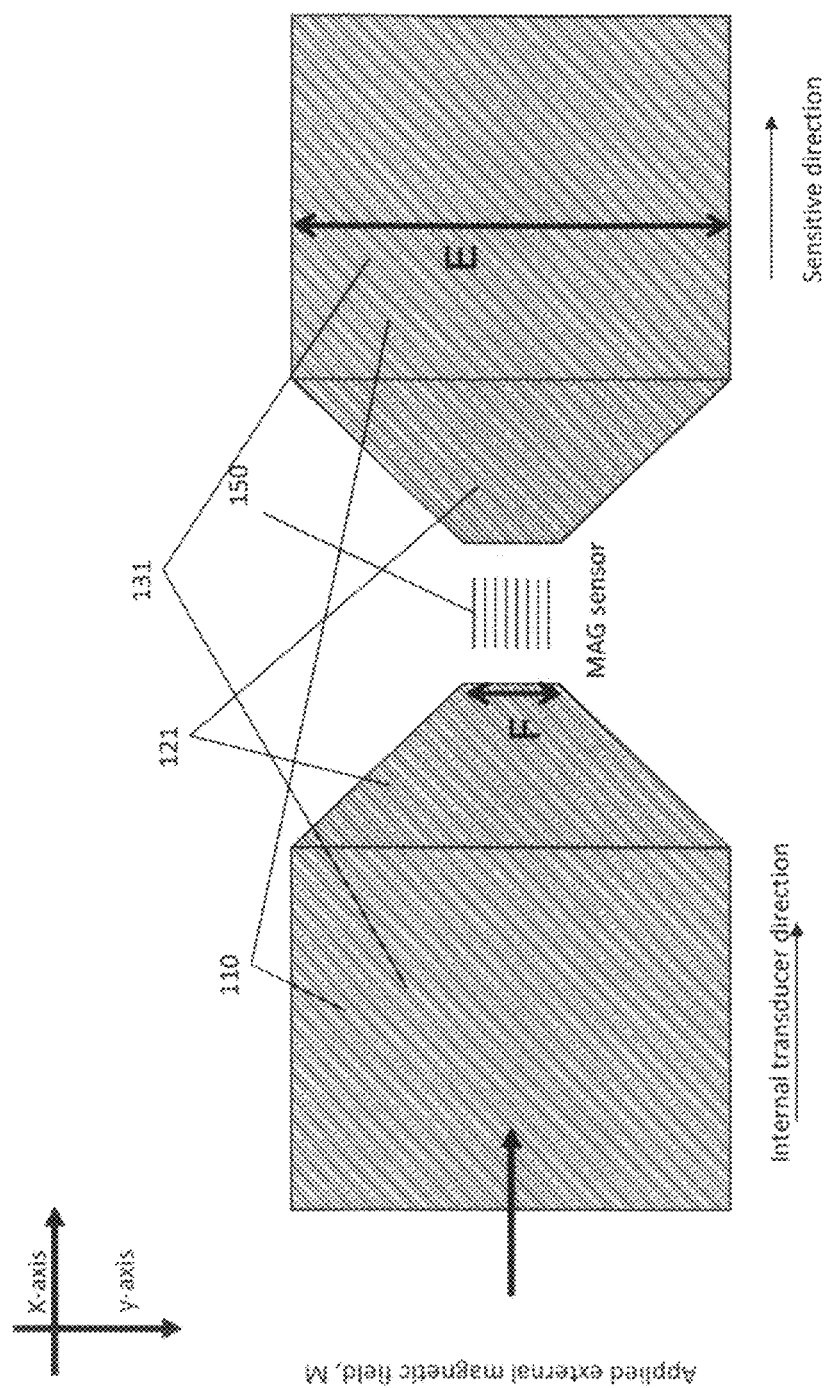
FIG. 3 is a simplified illustration of another embodiment of the microfabricated device with a magnetically sensitive structure with permeable flux guides that amplify the flux from the externally applied field along the sensitive axis of the magnetically sensitive structure.

FIG. 3 is a simplified illustration of another embodiment of the microfabricated device with a magnetically sensitive structure with permeable flux guides 110. The flux guides 110 in FIG. 3 are configured to amplify the flux from the externally applied field along the sensitive axis of the magnetically sensitive structure. This amplification is achieved by shaping the flux guides 110 with a tapered region 121 and an extended region 131. The tapered regions 121 join the extensive region 131 at a boundary whose dimension may match the largest lateral dimension E of the tapered region with the lateral dimension E of the extensive region. From this maximum dimension E, the tapered regions 121 decrease in dimension until a narrowest dimension F is achieved. This narrowest dimension F may occur directly adjacent to the magnetically sensitive structure. In this way, flux guides 110 serve to concentrate the lines of flux intercepted by lateral dimension E into a smaller lateral dimension F. This may enhance the signal strength of the magnetically sensitive structure 150 in response to an applied magnetic field M. In the example shown in FIG. 3, the device is most sensitive to components of the external applied fields that lie along the x-axis, as shown.

Accordingly, the magnetic transducer of FIG. 3 has at least one flux guide which is configured to amplify a component of the external magnetic field that is parallel to the one axis of the magnetically sensitive structure. More particularly, the magnetic transducer of FIG. 3 has at least one flux guide which has a first portion with a larger lateral extent further from the magnetically sensitive structure than a second portion closer to the magnetically sensitive structure, which has a smaller lateral extent, so as to concentrate components of the external magnetic field traveling from the first portion to the second portion.

Figure 4:
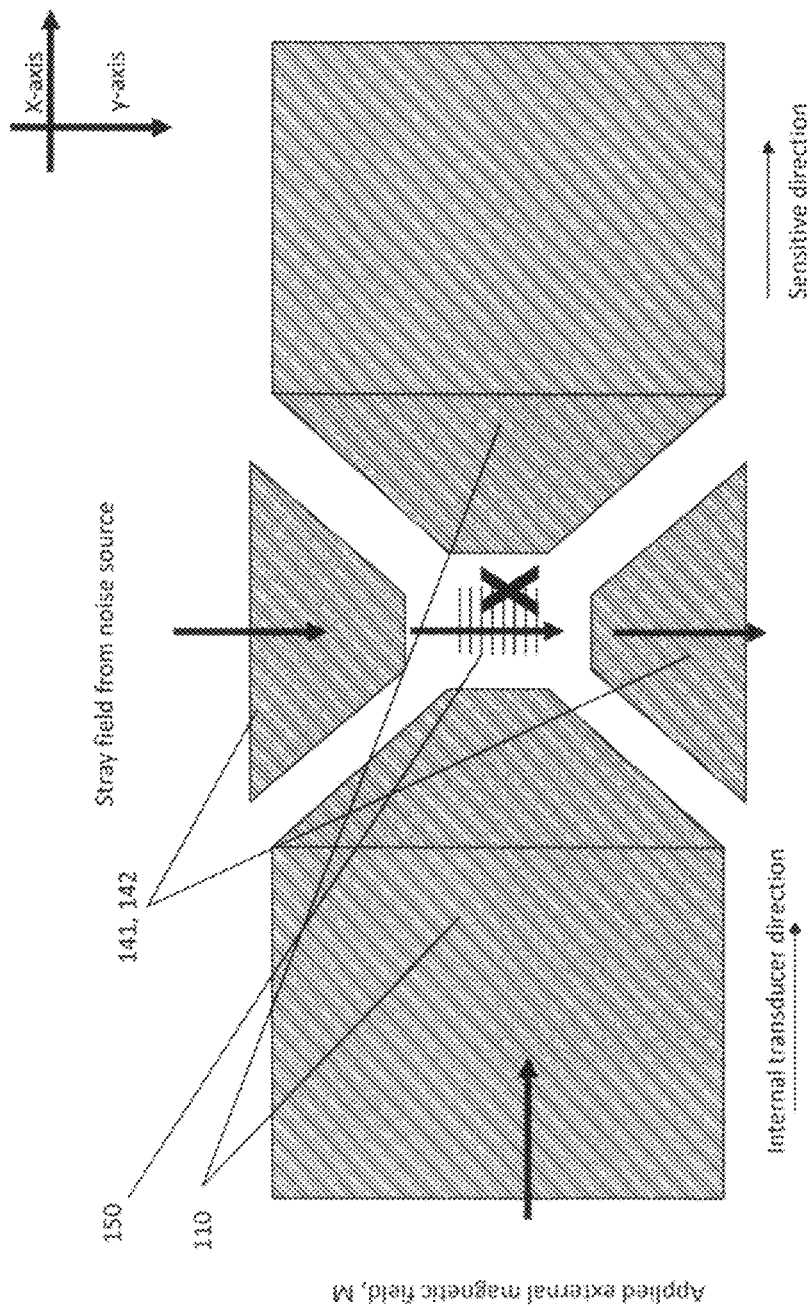
FIG. 4 is a simplified illustration of a magnetically sensitive structure with permeable flux guides that suppress flux from other, off-axis components of the externally applied field by applying those components perpendicularly to the sensitive axis of the magnetically sensitive structure.

FIG. 4 is a simplified illustration of another embodiment of the microfabricated device with a magnetically sensitive structure with permeable flux guides 110. The embodiment shown in FIG. 4 is again, most sensitive to components of the external applied fields that lie along the x-axis, as shown. However, this embodiment has the additional feature that routes fields orthogonal to the applied field M through the magnetically sensitive structure 150 along the perpendicular axis, that is, the y-axis. The magnetically sensitive structure 150 is generally insensitive to field components along this line. Accordingly, the microfabricated device is generally insensitive to noise sources that emit field lines along the y-axis.

To perform this function, the microfabricated device may include a third and a fourth flux guide 141 and 142 respectively, which may have a shape similar to flux guides 110. However, flux guides 141 and 142 are oriented along the y-axis, perpendicular to flux guides 110, which were along the x-axis. As a result, flux guides 141 and 142 gather lines of flux directed along the y-axis, and focus them across the magnetically sensitive structure 150, but along its insensitive axis.

Figure 5:
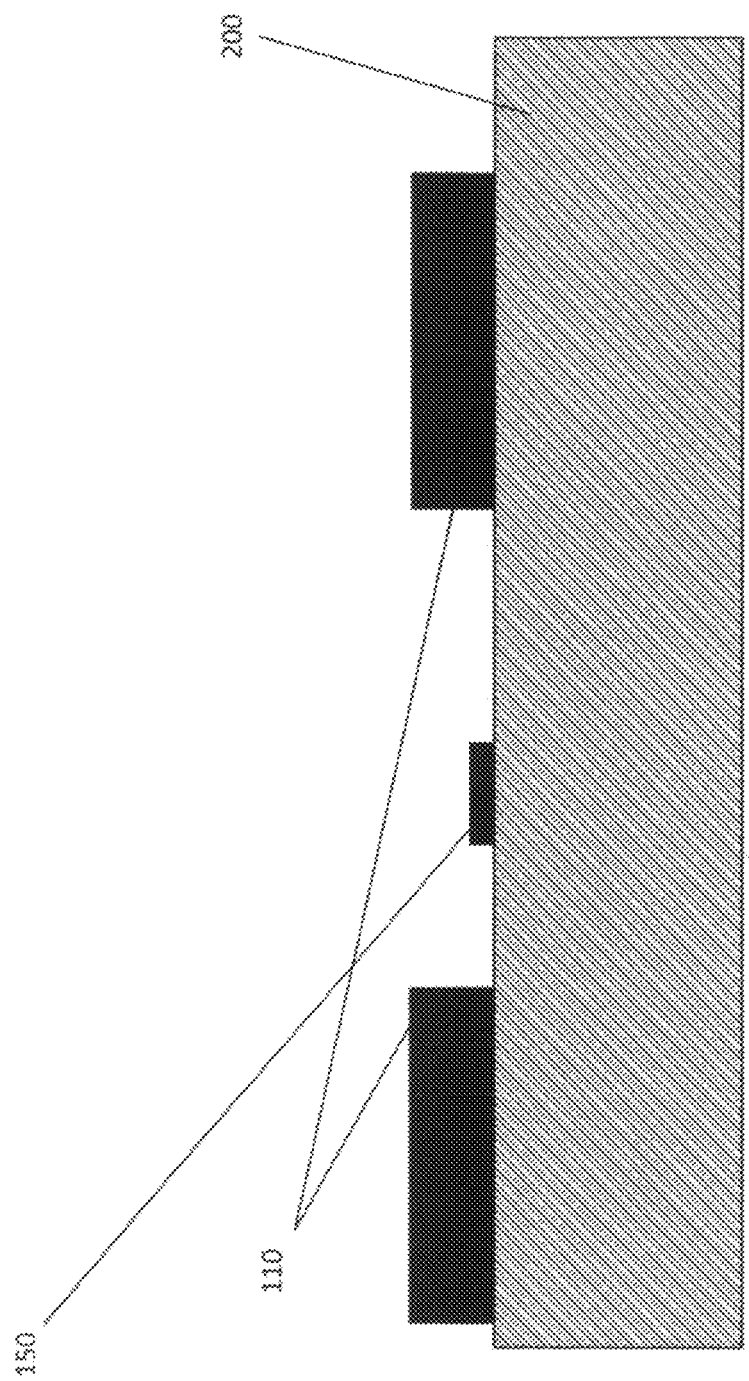
FIG. 5 is a cross sectional diagram of a microfabricated device with a magnetically sensitive structure wherein a plurality of flux guides is disposed in the same plane as the magnetically sensitive structure.

FIG. 5 illustrates a fabrication technique for the microfabricated device with a magnetically sensitive structure. In this embodiment, there may be a plurality of flux guides disposed in the same plane as the magnetically sensitive structure. The device may be manufactured as follows. The magnetically sensitive structure may be formed using techniques well known in the art, and as disclosed in U.S. Pat. No. 7,898,249 and others. The flux guides may be added to this structure by first passivating the surface of the substrate 200. If the substrate is silicon, for example, a suitable passivating layer may be silicon dioxide, deposited on the surface. A seed layer, for example, Ti/W or Cr/Au may then be deposited over the passivating layer by sputtering, CVD or plasma deposition. This layer may be covered with photoresist and patterned according to the desired shape of the flux guides 110. Unwanted areas of photoresist and seed layer may then be removed by chemical etching. The flux guides may then be deposited over the patterned seed layer by sputtering, plasma deposition or electrochemical plating. It is known that permalloy (80% Ni and 20% Fe), for example, can readily be deposited by electroplating. Further details into the lithographic formation of magnetically permeable materials may be found in, for example, U.S. patent application Ser. No. 13/374,898, assigned to the same assignee as the present invention. U.S. patent application Ser. No. 13/374,898 is hereby incorporated by reference in its entirety.

As before, this device uses a magnetically sensitive structure 150 such as an AMR or GMR device, in combination with highly permeable flux guides 110. As shown in FIG. 5, the flux guides 110 may be formed so as to be co-planar with the magnetically sensitive structure 150. Multiple flux guides 110 may be formed simultaneously on the same substrate 200 as shown in FIG. 5.

Figure 6:
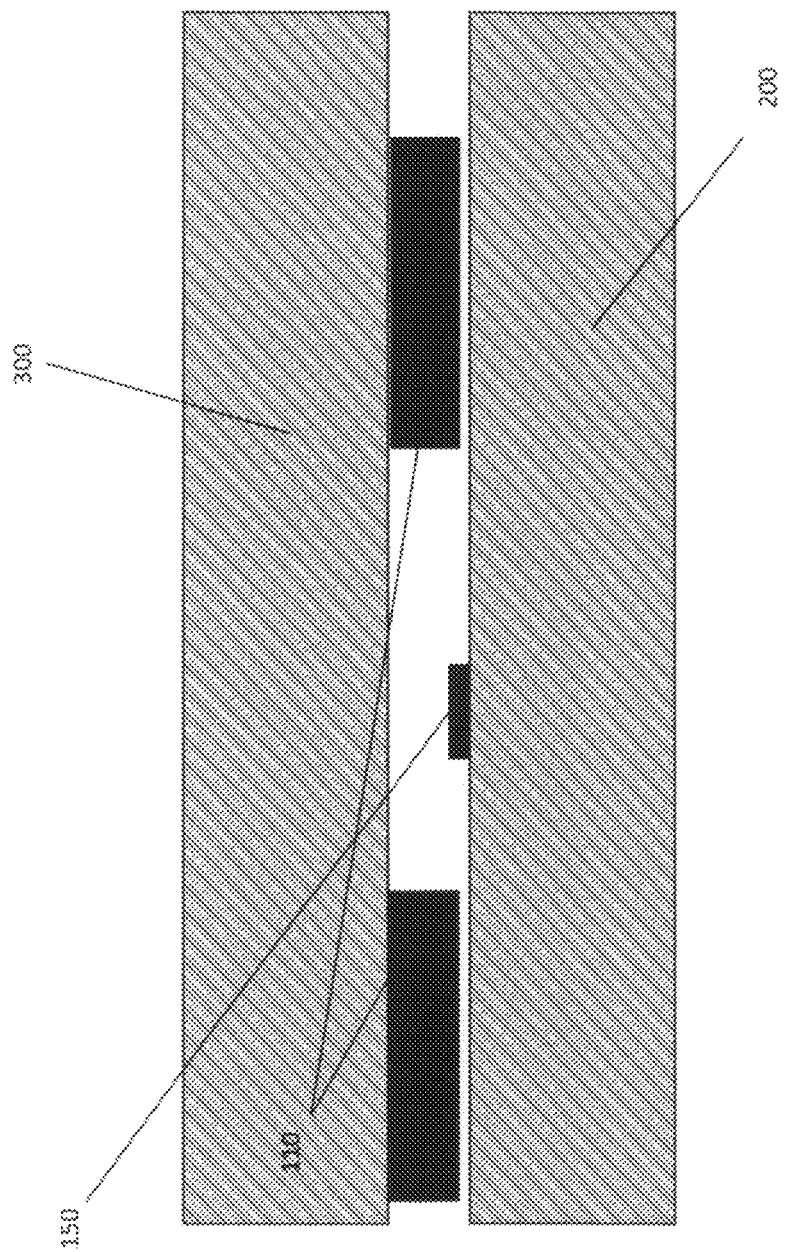
FIG. 6 is a cross sectional diagram of a microfabricated device with a magnetically sensitive structure wherein a plurality of flux guides is disposed on a different substrate than the magnetically sensitive structure.

FIG. 6 illustrates a second fabrication technique for the microfabricated device with a magnetically sensitive structure. In this embodiment, there may be a plurality of flux guides is disposed in the same plane as the magnetically sensitive structure. As before, this device uses a magnetically sensitive structure 150 such as an AMR or GMR device, in combination with highly permeable flux guides 110. However, in this embodiment, the magnetically sensitive structure 150 may be fabricated on a first substrate 200, and flux guides 110 may be fabricated on a second substrate 300. The sensing device is formed when the first substrate is bonded to the second substrate. A low temperature adhesive such as a polymer bond may be used to bond the substrates together.

Figure 7:
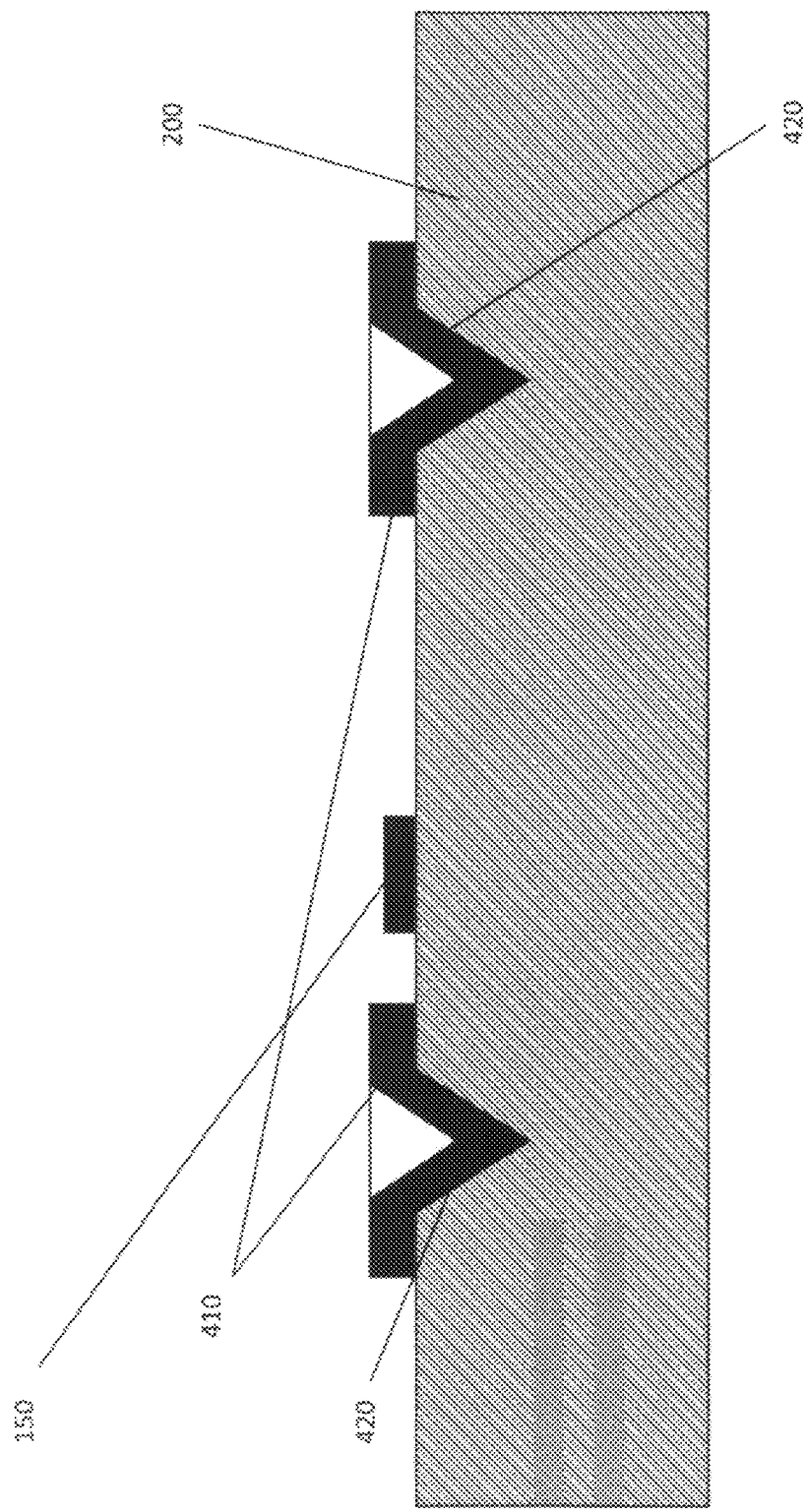
FIG. 7 is a cross sectional diagram of a microfabricated device with a magnetically sensitive structure wherein a plurality of flux guides is disposed across the thickness of the substrate supporting the magnetically sensitive structure.

FIG. 7 is a simplified cross section of another embodiment of the microfabricated device with a magnetically sensitive structure with permeable flux guides 110. In contrast to previous embodiments wherein the flux guides were planar thin films 110, in this embodiment the flux guides 410 have a substantial extent in the orthogonal direction. For example, the permeable material of the flux guides 410 may be deposited in a trench 420 formed on the surface of the substrate 200. The trench may be formed by anisotropic chemical etching, for example, etching in a solution of potassium hydroxide (KOH). This etching technique is well known in the art, and forms a trench with a sidewall angle of about 54.7 degrees.

Because of the shape of the flux guides shown in FIG. 7, the flux guides may intercept magnetic flux better if it is not exactly co-planar with the magnetically sensitive structure 150. As described previously, magnetically permeable materials tend to affect lines of flux from a magnetic field, because they offer a lower reluctance pathway to field lines emanating from a magnetic pole to the opposite magnetic pole, than does a trajectory through air or free space. Accordingly, the flux guides in FIG. 7 may collect additional flux lines from a magnetic field that does not fall exactly in the plane of the device. Therefore, the embodiment shown in FIG. 7 may generate a larger output signal for the same magnitude of externally applied magnetic field.

Accordingly, the cross sectional views of FIGS. 5-7 may show a magnetic transducer wherein the at least one flux guide is disposed on the same surface as the magnetically sensitive structure, or wherein the at least one flux guide is substantially parallel or perpendicular to the surface of the substrate on which the magnetically sensitive structure is disposed.

Figure 8:
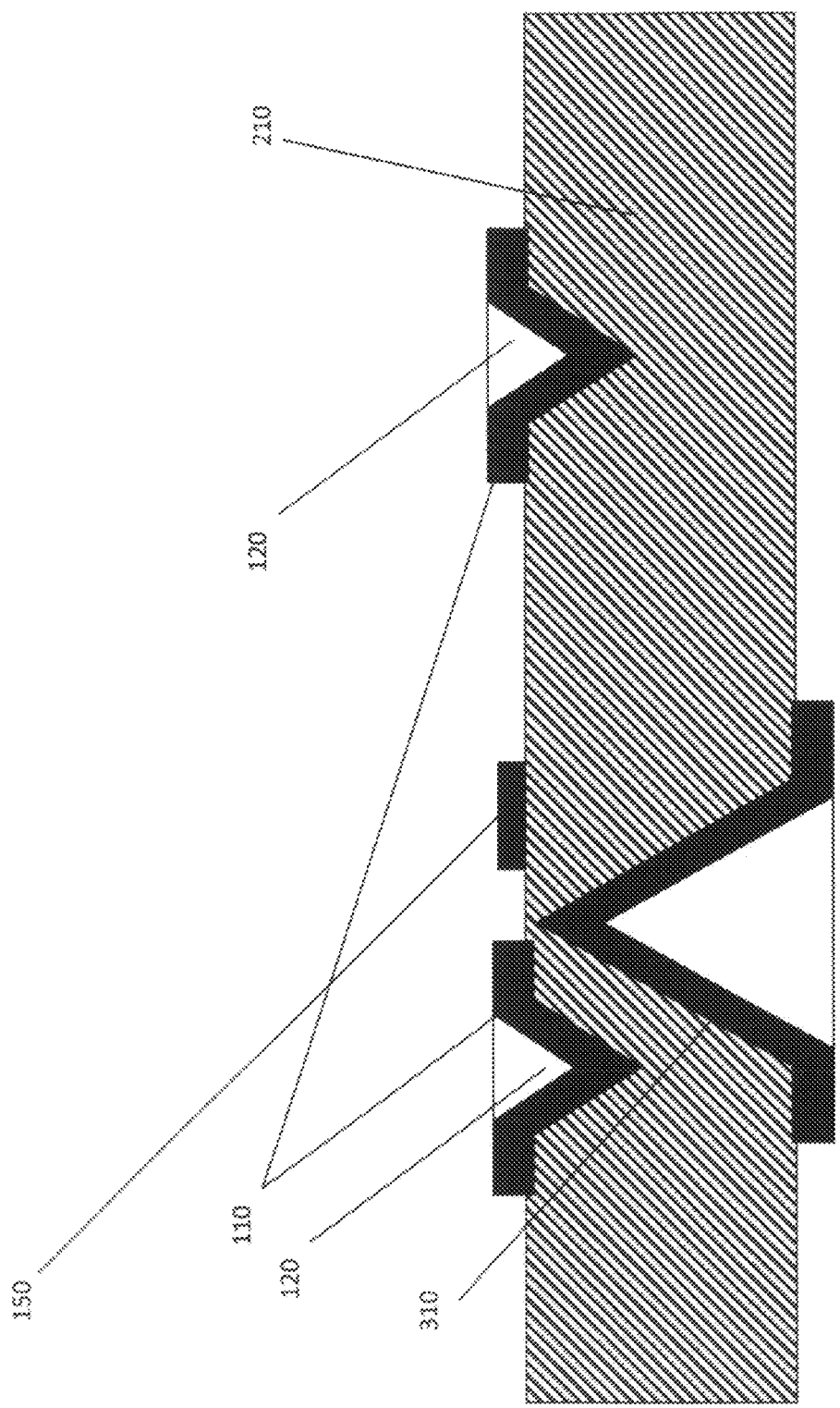
FIG. 8 is a cross sectional diagram of a microfabricated device with a magnetically sensitive structure wherein a plurality of flux guides is disposed across the thickness of the substrate supporting the magnetically sensitive structure, and on both surfaces of the substrate.

FIG. 8 is a simplified cross section of another embodiment of the microfabricated device with a magnetically sensitive structure with permeable flux guides. In contrast to the embodiment illustrated in FIG. 7, the embodiment shown in FIG. 8 has at least one flux guide 310 on the opposite surface of the fabrication substrate than the magnetically sensitive structure 150 is fabricated on. For the same reasons as set forth with respect to FIG. 7, this embodiment may be more effective in capturing lines of flux which are not exactly co-planar with the magnetically sensitive device 150, in fact it may capture magnetic fields perpendicular to the substrate. There may also be manufacturing advantages to locating the flux guide on the opposing surface. For example, the magnetically sensitive structure may be enclosed with a lid for protection, while additional manufacturing steps are carried out on the backside of the substrate.

Figure 9:
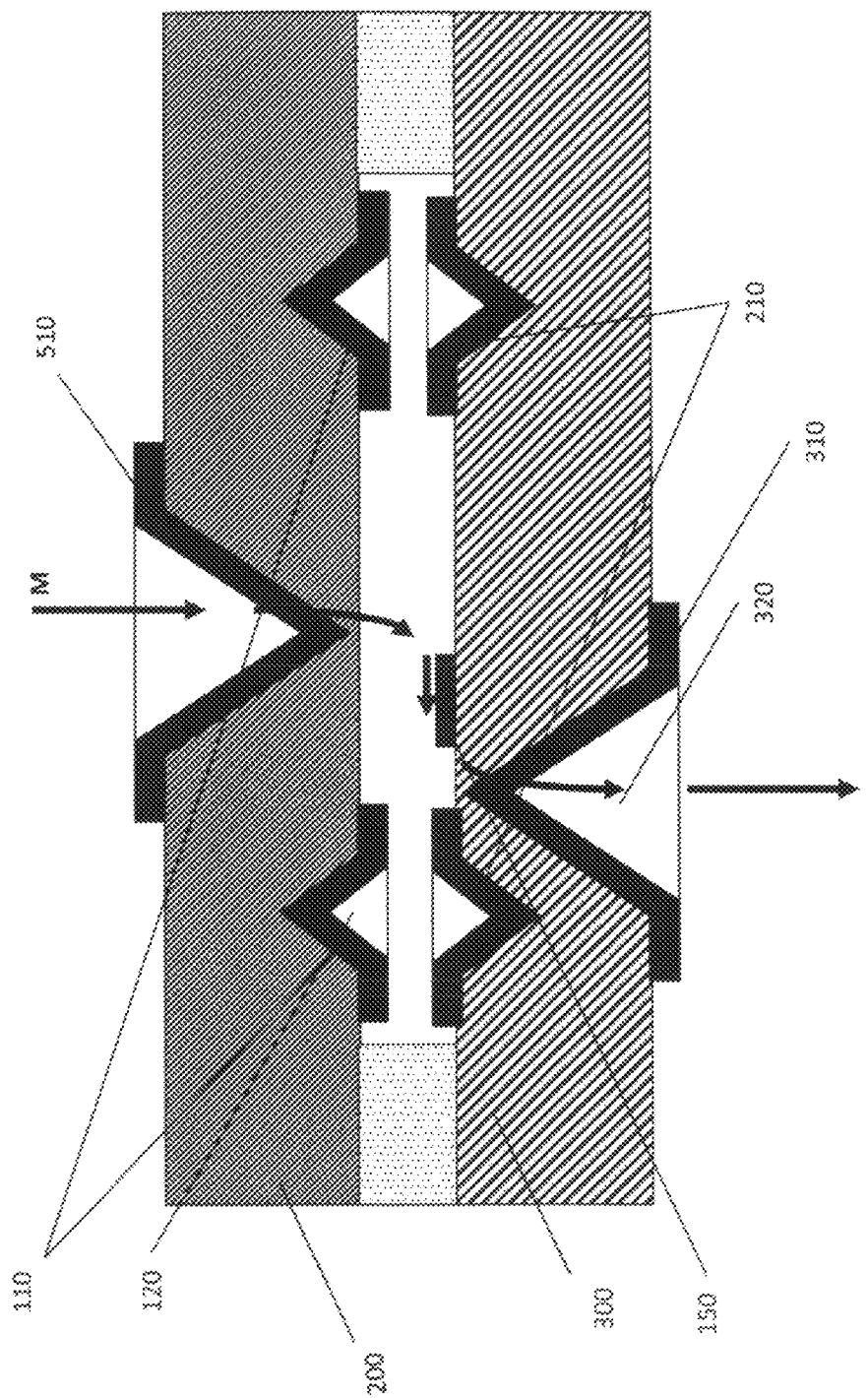
FIG. 9 is a cross sectional diagram of a microfabricated device with a magnetically sensitive structure showing two flux guides which route out-of-plane flux across the sensitive axis of the magnetically sensitive structure, from the bottom surface of the device, through the structure, and to the top surface of the device.

While only a single flux guide 310 may be required for operation of the microfabricated transducer as shown in FIG. 8, the performance may be enhanced by the addition of a second "pickup" flux guide 330. This embodiment is shown in FIG. 9. The first flux guide 310 may serve to collect lines of flux that occur outside the plane of the magnetically sensitive structure 150 and deliver these lines into the magnetically sensitive structure 150. The second flux guide 330 may provide an output path to these flux lines, giving them a lower reluctance return path to the opposite magnetic pole than they otherwise would have. This allows the magnetically sensitive structure to respond to field lines perpendicular to the substrate surface. The other flux guides 410 and 430 may serve to shield the magnetically sensitive structure 150 from in-plane or stray fields, as described previously.

Figure 10:
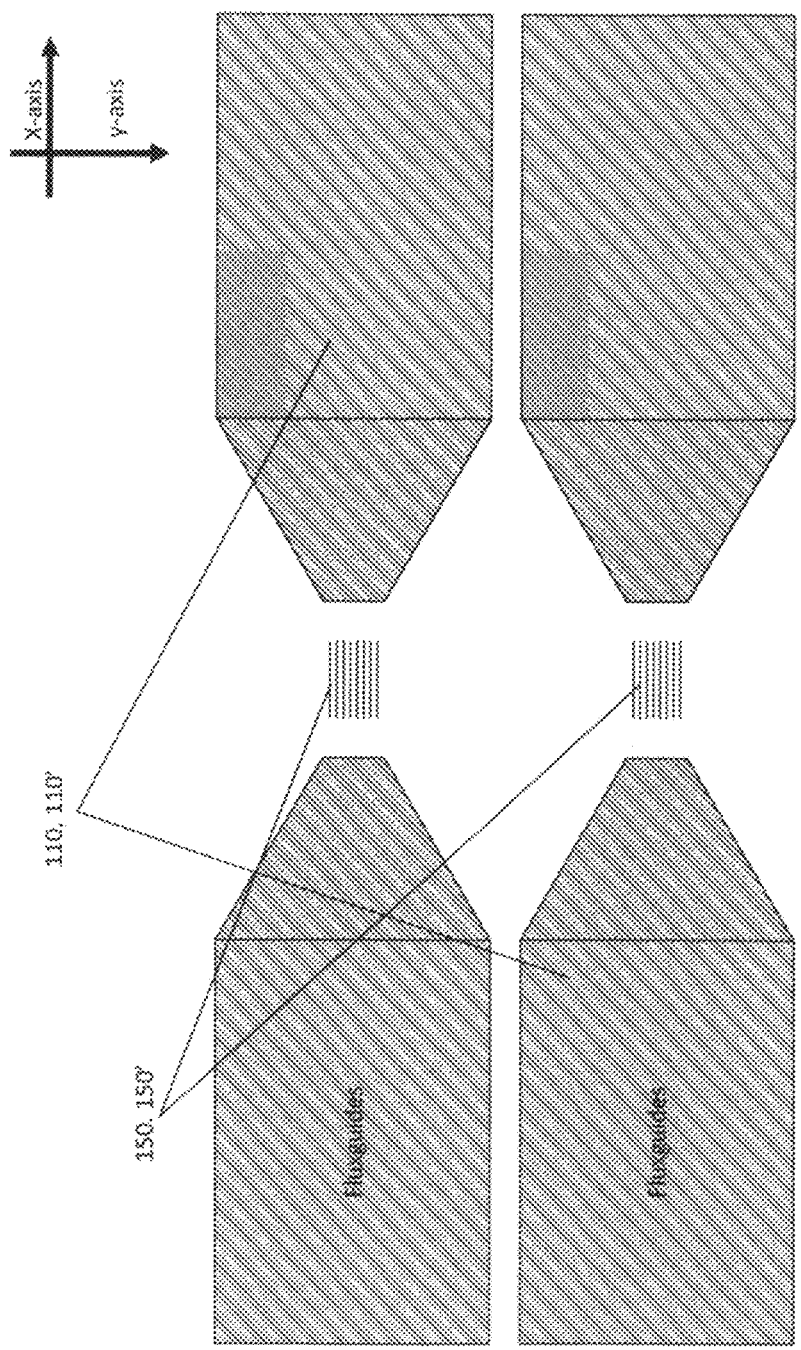
FIG. 10 is a plan view of a microfabricated device with a magnetically sensitive structure showing a plurality of flux guides and magnetically sensitive structures all lying in the same fabrication plane, and with their axes of maximum sensitivity aligned substantially parallel to one another.

FIG. 10 is a plan view of another embodiment of the microfabricated device with a magnetically sensitive structure. In this embodiment, there may be a plurality of magnetically sensitive structures 150, 150' and flux guides 110 and 110' on a single fabrication substrate. While two magnetically sensitive structures 150 and 150' are shown in FIG. 10, it should be understood that this idea can be extended to any number of magnetically sensitive structures. As the device may be made lithographically as described above, structures with quite small feature sizes may be realized. The plurality of magnetically sensitive devices may each have a sensitive axis, and these sensitive axes may be aligned substantially parallel to one another. Alternatively, other embodiments with multiple magnetically sensitive structures on a single substrate are described below, wherein the multiple structures are aligned with their axes non-parallel. This may enable a multi-axis transducer as described further below with respect to FIGS. 11 and 12.

Figure 11:
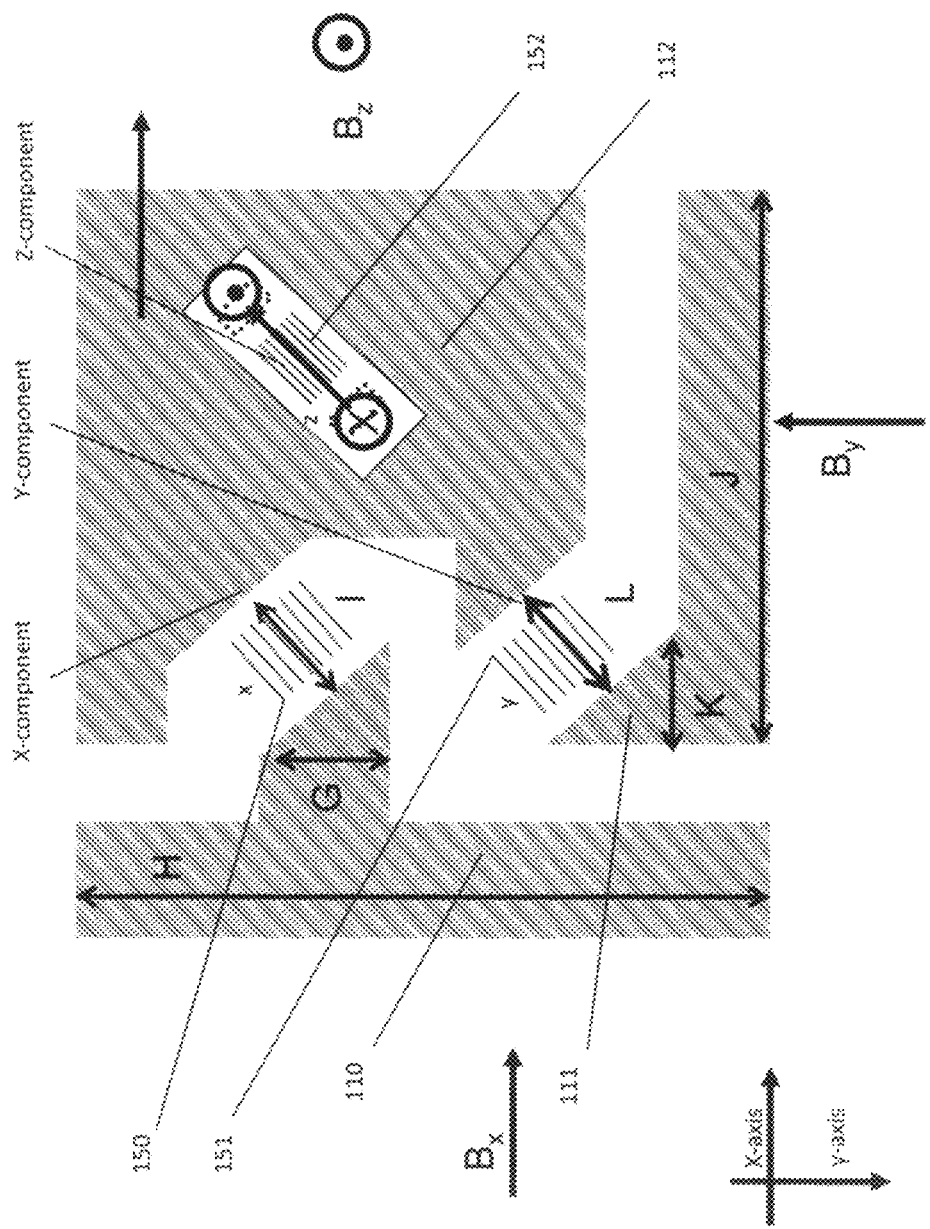
FIG. 11 is a plan view of an integrated, 3-axis microfabricated device with magnetically sensitive structures which have output proportional to the magnetic field strength along the x, y and z axes.

FIG. 11 is a plan view of another exemplary embodiment of the microfabricated device with a magnetically sensitive structure. In this embodiment, there may be a plurality of magnetically sensitive structures 150, 151, and 152, one for each axis or spatial dimension. Magnetically sensitive structure 150 is intended to measure the component of the externally applied field which lies primarily on the x-axis. Magnetically sensitive structure 151 is intended to measure the component of the externally applied field which lies primarily on the y-axis. Magnetically sensitive structure 152 is intended to measure the component of the externally applied field which lies primarily on the z-axis. Flux guides 110, 111 and 112 route the components of the flux to each of these magnetically sensitive structures. Considering first the operation of flux guide 110, flux guide 110 has a protruding region with a characteristic dimension G and an extensive region with a characteristic dimension H. The extensive region serves to accept flux lines oriented substantially along the x-axis. It concentrates these flux lines into the protruding region having the characteristic dimension of only G.

The protruding region is then separated by a distance of only I, wherein I is less than the other characteristic dimensions, and is less than the separation between flux guide 110 and flux guides 111 and 112. Accordingly, most of the lines of flux falling on or near the x-axis are detected by magnetically sensitive structure 150.

Similarly, flux guide 111 has an extensive region and a protruding region. The extensive region has a characteristic dimension J and the protruding region has a characteristic dimension K. The extensive region is shaped to accept flux lines falling on or near the y-axis. These flux lines are then concentrated in the protruding region having the characteristic dimension K. The protruding region is separated from the adjacent flux guide 112 by a narrow gap L. To the extent that the gap L is small compared to characteristic dimension K, most or all of the flux travelling in flux guide 111 will be delivered across the magnetically sensitive structure 151.

Accordingly, magnetically sensitive structure 151 will respond primarily to the components of the externally applied field that lie along the y-axis.

Finally, magnetically sensitive structure 152 is surrounded by the planar, permeable flux guide 112. This flux guide along with flux guide 110 will absorb and route most of the flux falling in the x-y plane either into magnetically sensitive structure 150 or 151. For flux falling along the z-axis (perpendicular to the plane of the paper and in cross section such as FIG. 9), magnetically sensitive structure 152 will respond to this component. Accordingly, the systems and methods described here enable a fully integrated, 3-axis microfabricated transducer that can be packaged as a single unit. Significant cost savings may be realized with such a device.

Figure 12:
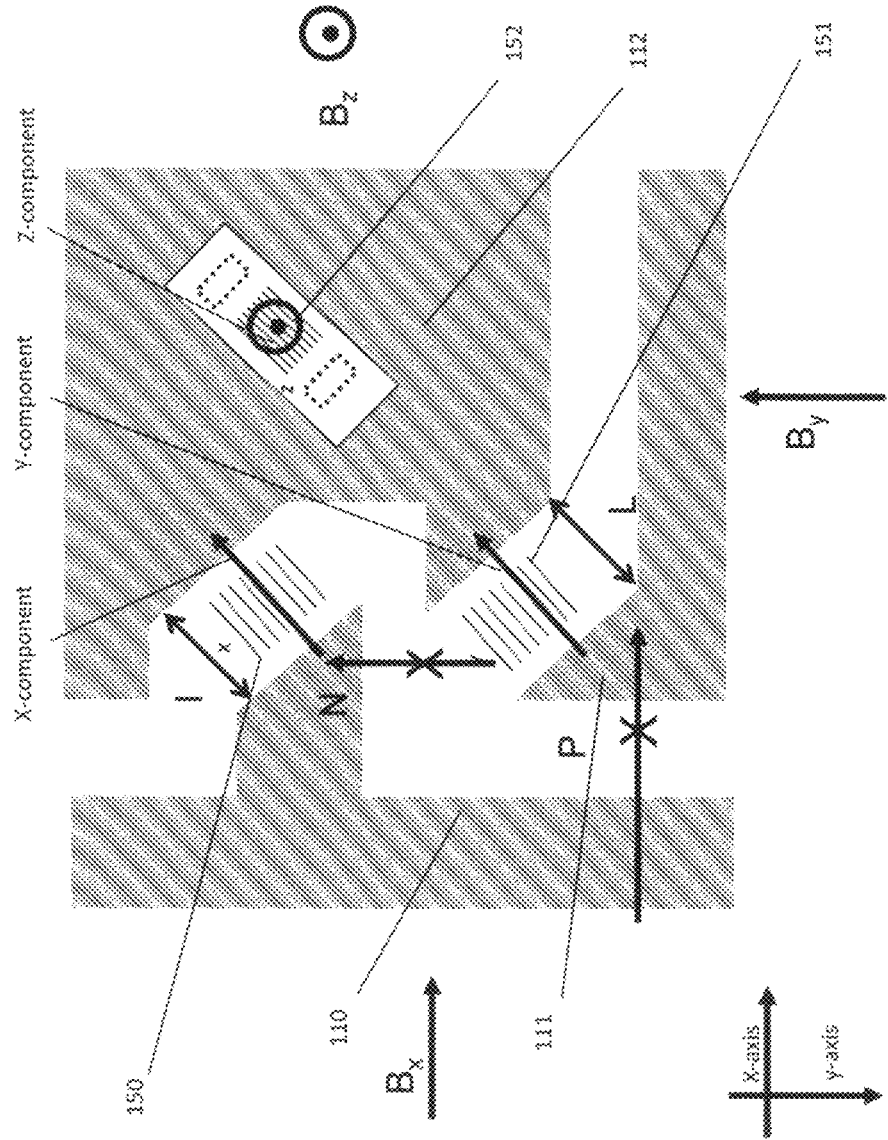
FIG. 12 is a plan view of an integrated, 3-axis microfabricated device with magnetically sensitive structures which have output proportional to the magnetic field strength along the x, y and z axes, showing how noise from off-axis flux lines are suppressed.

FIG. 12 illustrates schematically why the design shown in FIG. 11 reduces cross talk between the components of the external applied magnetic field. Components of the flux along the x-axis have difficulty leaping from flux guide 110 to flux guide 111, because of the relatively large gap shown in the figure. Similarly, flux along the y-component has difficulty leaping from flux guide 111 to flux guide 110 across the gap shown. Instead, each of these components is provided with a low reluctance path to the appropriate magnetically sensitive structure, 150 or 151 as the case may be.

Generally speaking, the magnetic transducer of FIGS. 11 and 12 has at least one flux guide which is configured to rotate an off-axis component of the external magnetic field into the one axis by providing a low reluctance path for the one component of the external magnetic field through the one axis of the magnetically sensitive structure. Furthermore, the magnetic transducer of FIGS. 11 and 12 may have at least one flux guide which is configured to suppress a response of the transducer to some components of the external magnetic field by providing a low reluctance path such that these components are applied either perpendicularly to the one axis of the magnetically sensitive structure, or are routed around the magnetically sensitive structure.

The magnetic transducer depicted in FIGS. 11 and 12 may also have one or more of the following features: 1) it may have at least one flux guide which is configured to at least one of guide and amplify at least one component of the external magnetic field to the magnetically sensitive structure 2) it may have at least one flux guide which presents a laterally extended portion that accepts one component of the external magnetic field, and provides a low reluctance path for the one component to the magnetically sensitive structure and parallel to the one axis of maximum sensitivity 3) it may have at least one flux guide which has a tapered portion adjacent to the laterally extended portion, which concentrates flux of the one component across the magnetically sensitive structure and applies the flux parallel to the one axis of maximum sensitivity 4) it may have at least one flux guide which is configured to suppress one or more undesired components of the external magnetic field for the magnetically sensitive structure; 5) it may have at least one flux guide which presents a laterally extended portion in a direction of the undesired components, and provides a low reluctance path for the undesired components around the magnetically sensitive structure; 6) it may have at least one flux guide which is configured to separate cross talk between components of the external magnetic field; 7) it may have at least a first flux guide and a second flux guide, wherein the first flux guide preferentially accepts desired components of the external magnetic field and provides a low reluctance path to deliver the desired components parallel to the one axis of sensitivity, and the second flux guide accepts undesired components and provides a low reluctance path not parallel to the one axis of maximum sensitivity.

One or more of these features may be combined to create a multi-axis, integrated, robust, magnetic field transducer which has separate signal outputs corresponding to the relative magnitude of the flux from a magnetic field in each of the three orthogonal spatial dimensions. Accordingly, as shown in FIGS. 11 and 12, the three axis, integrated magnetic field transducer may include at least two magnetically sensitive structures, wherein the magnetically sensitive structures each have an axis of maximum sensitivity, which are substantially orthogonal to one another, for example along the x- and y-axes. "Substantially orthogonal" should be understood to mean that the axis of maximum sensitivity in one magnetically sensitive structure is rotated by an angle of at least about 60 degrees from the axis of maximum sensitivity of the other magnetically sensitive structure. It may further include at least two flux guides, wherein a first flux guide routes lines of flux traveling in along a first spatial dimension into one of the two magnetically sensitive structures, and the second flux guide routes lines of flux traveling in along a second orthogonal spatial dimension into the other of the two magnetically sensitive structures. The first flux guide may route lines of flux traveling along the second orthogonal dimension around the first magnetically sensitive structure, and the second flux guide may route lines of flux traveling along the first spatial dimension around the second magnetically sensitive structure. Finally, the magnetic transducer may include a third (z-axis) magnetically sensitive structure, wherein the third magnetically sensitive structure has an axis of maximum sensitivity, which is substantially orthogonal to axes of sensitivity of the first (x-axis) and second (y-axis) magnetically sensitive structures.

Figures 13A, 13B:
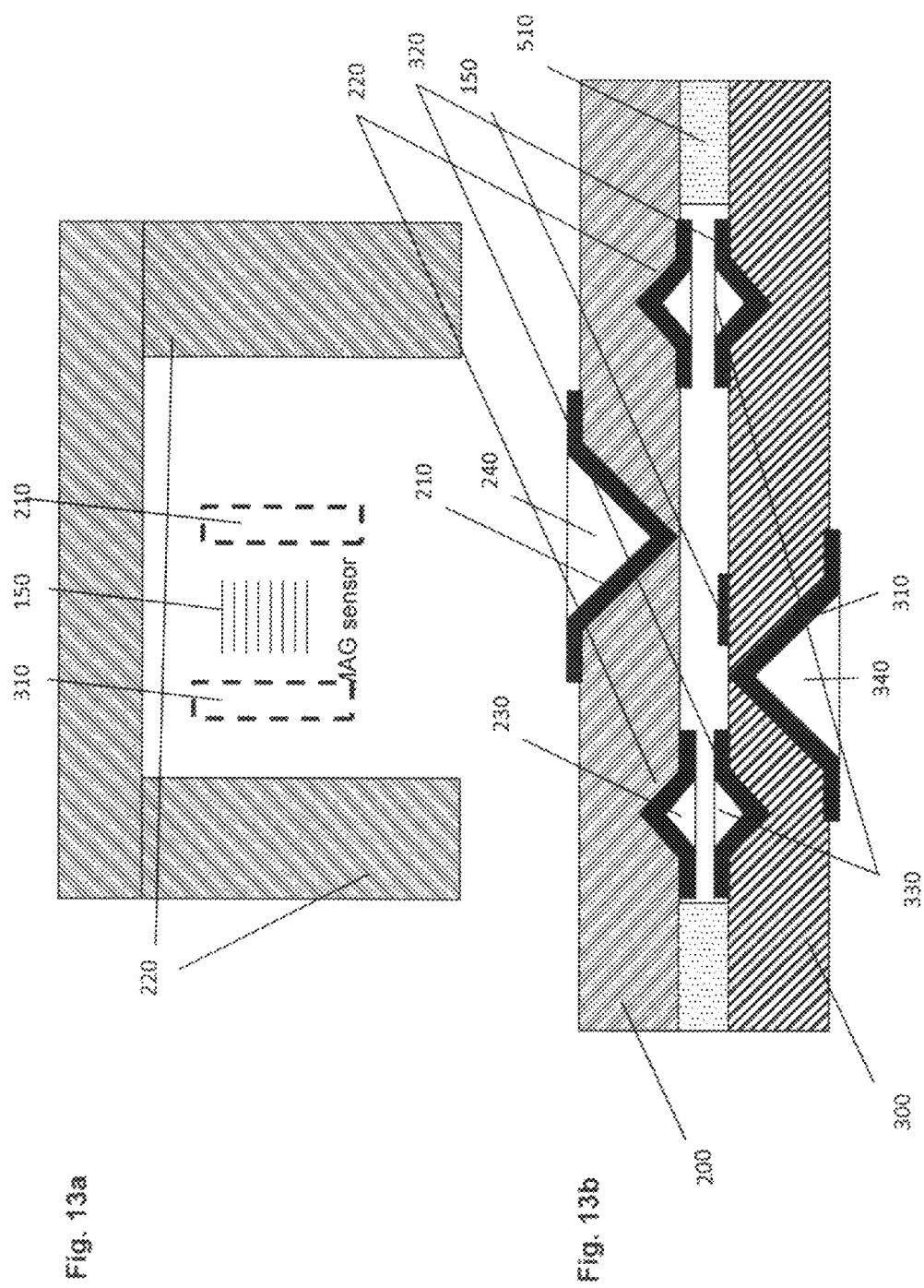
FIG. 13a is a plan view and FIG. 13b is a cross sectional diagram of a manufacturing process including packaging for the microfabricated device with a magnetically sensitive structure having a flux guides, wherein the device is fabricated on two substrates which are bonded together.

FIG. 13*a* is a plan view of the completed, packaged, one-axis device, and FIG. 13*b* is a simplified cross section of the completed, packaged device. The microfabricated transducer may be similar to that illustrated in FIG. 9. This axis of sensitivity of this device may be along the x- or y-axis, according to the details of the flux guide shapes. In this example, three flux guides may be disposed on the surfaces of two substrates 200 and 300. Two of the flux guides 210 and 310 serve to route out of plane fields to and from the magnetically sensitive structure 150. The combined flux guide 220 and 320 shield the magnetically sensitive structure or shunt the flux in an insensitive direction, as described previously.

The fabrication of this device will be described next. Similar to the process described previously, the fabrication of the microfabricated transducer may begin with the formation of the magnetically sensitive structure 150. The structure may be AMR, GMR, Hall effect, or some other structure sensitive to the orientation and magnitude of an applied electric field. After fabrication of the magnetically sensitive structure 150 on substrate 300, trenches 330 and 340 may be formed in the substrate. For example, it is well known that trenches may be formed using anisotropic chemical etching with KOH. The trenches may be, for example, 50 microns deep and about 50 microns across. After etching the trenches, the substrate may be passivated, by for example, growing or depositing an oxide coating. After passivation, the passivated substrate 300 may be covered with a seed layer and then photoresist. An example of an acceptable seed layer material may be chromium (Cr) and gold (Au), with a thickness of about 10 nm. The photoresist may then be patterned to correspond to the areas in which the permeable material is desired. Ordinarily, the seed layer will remain in the trench area, and the permeable material will be plated on the seed layer in these areas.

The seed layer may be a thin metallic seed layer, such as chromium (Cr) and gold (Au). Photoresist is then deposited over the seed layer. The photoresist may then be patterned according to the shapes of the permeable flux guides. Finally, a magnetically permeable material such as NiFe permalloy (70-80% Ni, 30-20% Fe) may be plated onto the patterned photoresist and seed layer, forming the magnetically permeable flux guide structures 310 and 320. The photoresist and non-plated portions of the seed layer may then be removed. An etch mask may subsequently cover the permalloy structures to avoid etching them during the formation of the remainder of any remaining micromechanical features.

The upper substrate 200, supporting only flux guides 210 and 220 and not the magnetically sensitive structure, may be fabricated using a similar process to that described above for the substrate 300 supporting the magnetically sensitive structure and flux guides. Any or all of flux guides, for example, 210, 220, 310 and 320 may be formed in a trench made by, for example, KOH etching, or they may be formed as a planar film. If a planar film, acceptable exemplary dimensions may be 100 microns wide, 20 microns wide, and 10 microns thick. Although permalloy (80% Ni and 20% Fe) is used in these embodiments, it should be understood that any permeable material with a relative permeability in excess of about 100 and that can be patterned in appropriate shapes as described above, may be suitable. Alternative materials may include manganese zinc ferrites or mu-metals (77% nickel, 16% iron, 5% copper and 2% chromium or molybdenum.)

After completion of the flux guides on the upper substrate 200 and lower substrate 300, the substrates may be bonded together. As before, a low temperature polymer bond 510 may be adequate for this application.

FIGS. 14*a* and 14*b* illustrate in plan view and in cross section, another method for manufacturing the magnetic transducer device. In this method, standard machining and integrated circuit packaging techniques may be used to fabricate the device. After forming the magnetically sensitive structure 150 on a substrate 500, the flux guides 110 may be formed by machining a surface in the shape shown in FIG. 14. The permeable features may be ground or lapped until flat. Thereafter, the two structures 700 and 800 may be joined together using a polymer adhesive. The cavity that remains between the surfaces may be filled with a potting compound, as is well known from semiconductor packaging methodology.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to a magnetically sensitive thin film structure, it should be understood that the techniques and designs described above may be applied to any of a number of macroscopic transducers, such as a Hall effect transducer or reed transducer. Accordingly, the exemplary implementations set forth above, are intended to be illustrative, not limiting.

What is claimed is:

1. A magnetic transducer sensitive to an external magnetic field, comprising:
   a magnetically sensitive structure having one axis of maximum sensitivity, disposed on a surface of a substrate; and
   a first flux guide and a second flux guide, having high magnetic permeability and configured to route at least one component of the external magnetic field along the axis of the magnetically sensitive structure, wherein at least one flux guide is configured to at least one of guide and amplify at least one component of the external magnetic field to the magnetically sensitive structure,
   wherein the first flux guide preferentially accepts desired components of the external magnetic field and provides a low reluctance path to deliver the desired components parallel to the one axis of sensitivity, and the second flux guide accepts undesired components and provides a low reluctance path not parallel to the one axis of maximum sensitivity, whereby the first flux guide and second flux guide are configured to separate cross talk between components of the external magnetic field, by shunting some lines of flux around the magnetically sensitive structure.

2. The magnetic transducer of claim 1, further comprising at least two magnetically sensitive structures, wherein the at least two magnetically sensitive structures each have an axis of maximum sensitivity, wherein the two axes of maximum sensitivity of the two magnetically sensitive structures are substantially orthogonal to one another.

3. The magnetic transducer of claim 2, further comprising a third magnetically sensitive structure, wherein the third magnetically sensitive structure has an axis of maximum sensitivity, which is substantially orthogonal to axes of sensitivity of the first and second magnetically sensitive structures.

4. The magnetic transducer of claim 2, further comprising at least two flux guides, wherein a first flux guide routes lines of flux traveling in along a first spatial dimension into one of the two magnetically sensitive structures, and the second flux guide routes lines of flux traveling in along a second orthogonal spatial dimension into the other of the two magnetically sensitive structures.

5. The magnetic transducer of claim 4, wherein the first flux guide routes lines of flux traveling along another orthogonal dimension around the first magnetically sensitive structure, and the second flux guide routes lines of flux traveling along the first spatial dimension around the second magnetically sensitive structure.

* * * * *